United States Patent [19]
Ball

[11] Patent Number: 6,080,264
[45] Date of Patent: Jun. 27, 2000

[54] COMBINATION OF SEMICONDUCTOR INTERCONNECT

[75] Inventor: Michael B. Ball, Boise, Id.

[73] Assignee: Micron Technology, Inc., Boise, Id.

[21] Appl. No.: 08/818,636

[22] Filed: Mar. 14, 1997

Related U.S. Application Data

[62] Division of application No. 08/650,157, May 20, 1996.
[51] Int. Cl.[7] ........................................ H01K 3/05
[52] U.S. Cl. ............................... 156/292; 29/841
[58] Field of Search .................... 156/150, 292; 29/841

[56] References Cited

U.S. PATENT DOCUMENTS

| | | |
|---|---|---|
| 4,264,917 | 4/1981 | Ugon . |
| 4,701,236 | 10/1987 | Vieilledent ............................ 156/252 |
| 4,746,392 | 5/1988 | Hoppe ................................ 156/244.12 |
| 4,862,245 | 8/1989 | Pashby et al. . |
| 5,012,323 | 4/1991 | Farnworth . |
| 5,146,308 | 9/1992 | Chance et al. . |
| 5,147,815 | 9/1992 | Casto . |
| 5,229,647 | 7/1993 | Gnadinger . |
| 5,239,198 | 8/1993 | Lin et al. . |
| 5,252,857 | 10/1993 | Kane et al. . |
| 5,266,833 | 11/1993 | Capps . |
| 5,291,061 | 3/1994 | Ball . |
| 5,311,057 | 5/1994 | McShane . |
| 5,323,060 | 6/1994 | Fogal et al. ............................ 257/777 |
| 5,328,087 | 7/1994 | Nelson et al. .......................... 228/175 |
| 5,331,235 | 7/1994 | Chun . |
| 5,340,771 | 8/1994 | Rostoker ................................ 29/840 |
| 5,399,898 | 3/1995 | Rostoker . |
| 5,422,435 | 6/1995 | Takiar et al. . |
| 5,438,224 | 8/1995 | Papageorge et al. . |
| 5,471,369 | 11/1995 | Honda et al. . |
| 5,483,024 | 1/1996 | Russell et al. . |
| 5,484,959 | 1/1996 | Burns . |
| 5,491,612 | 2/1996 | Nicewarner, Jr. . |

FOREIGN PATENT DOCUMENTS

| | | |
|---|---|---|
| 576708 | 1/1994 | European Pat. Off. . |
| 52-40062 | 3/1977 | Japan . |
| 56-62351 | 5/1981 | Japan . |
| 58-18949 | 2/1983 | Japan . |
| 62-126661 | 6/1987 | Japan . |
| 1-28856 | 1/1989 | Japan . |
| 1-123428 | 5/1989 | Japan . |
| 2-211643 | 8/1990 | Japan . |
| 3-22544 | 1/1991 | Japan . |
| 3-169062 | 7/1991 | Japan . |

*Primary Examiner*—Francis J. Lorin
*Attorney, Agent, or Firm*—Trask, Britt & Rossa

[57] ABSTRACT

An apparatus and method for increasing integrated circuit density comprising utilizing chips with both direct (flip chip type) chip to conductors connection technology and wire bonds and/or TAB. An aspect of the present invention comprises at least one semiconductor die with a face surface having both flip chip type electric connections and bond pads for wirebonding or TAB attachment thereof to at least one leadframe. Another aspect of the present invention comprises using two pair of back to back attached dice with leadframe lead fingers disposed between the dice pairs. The die face surfaces adjacent to the lead fingers are in direct electrical communication therewith via flip-chip type connectors. Bond pads on the die face surface facing outward from the lead fingers are electrically connected to the leadframe via wire bonds and/or TAB.

16 Claims, 3 Drawing Sheets

COMBINATION OF SEMICONDUCTOR INTERCONNECT

PRIOR APPLICATION

This is a divisional of application Ser. No. 08/650,157, filed May 20, 1996, pending.

BACKGROUND OF THE INVENTION

1. Field of the Invention

The present invention relates to an apparatus and a method for increasing semiconductor device density. In particular, the present invention relates to a vertical multi-chip device using combined flip chip, wire bond, tape automated bonding ("TAB"), and leads over and under assembly techniques to achieve densely packaged semiconductor devices, and a method for producing such devices.

2. State of the Art

Definitions: The following terms and acronyms will be used throughout the application and are defined as follows:

BGA—Ball Grid Array: An array of minute solder balls disposed on an attachment surface of a semiconductor die wherein the solder balls are refluxed for simultaneous attachment and electrical communication of the semiconductor die to a printed circuit board. Conductive polymer balls or bumps may also be employed.

COB—Chip On Board: The techniques used to attach semiconductor dice to a printed circuit board, including flip chip attachment, wirebonding, and TAB.

Flip Chip: A chip or die that has a pattern or array of terminations spaced around the active surface of the die for face down mounting of the die to a substrate.

Flip Chip Attachment: A method of attaching a semiconductor die to a substrate in which the die is inverted so that the connecting conductor pads on the face of the device are set on mirror-image pads on the substrate (such as a printed circuit board), and bonded by solder reflux or a conductive polymer curing.

Glob Top: A glob of encapsulant material (usually epoxy or silicone or a combination thereof) surrounding a semiconductor die in a COB assembly.

PGA—Pin Grid Array: An array of small pins extending substantially perpendicular from the major plane of a semiconductor die, wherein the pins conform to a specific arrangement on a printed circuit board or other substrate for attachment thereto.

SLICC—Slightly Larger than Integrated Circuit Carrier: An array of minute solder balls disposed on an attachment surface of a semiconductor die similar to a BGA, but having a smaller solder ball pitch and diameter than a BGA.

TAB—Tape Automated Bonding. Conductive traces are formed on a dielectric film such as a polyimide (the structure also being termed a "flex circuit"), and the film is precisely placed to electrically connect die and a circuit board or leadframe through the traces. Multiple connections are simultaneously effected.

State-of-the-art COB technology generally consists of three semiconductor die to printed circuit board conductive attachment techniques: flip chip attachment, wirebonding, and TAB.

Flip chip attachment consists of attaching a semiconductor die, generally having a BGA, a SLICC or a PGA, to a printed circuit board. With the BGA or SLICC, the solder or other conductive ball arrangement on the semiconductor die must be a mirror-image of the connecting bond pads on the printed circuit board such that precise connection is made. The semiconductor die is bonded to the printed circuit board by refluxing the solder balls. With the PGA, the pin arrangement of the semiconductor die must be a mirror-image of the pin recesses on the printed circuit board. After insertion, the semiconductor die is generally bonded by soldering the pins into place. An under-fill encapsulant is generally disposed between the semiconductor die and the printed circuit board for environmental protection and to enhance the attachment of the die to the board.

Wirebonding and TAB attachment generally begins with attaching a semiconductor die to the surface of a printed circuit board with an appropriate adhesive, such as an epoxy. In wirebonding, a plurality of bond wires are attached, one at a time, to each bond pad on the semiconductor die and extend to a corresponding lead or trace end on the printed circuit board. The bond wires are generally attached through one of three industry-standard wirebonding techniques: ultrasonic bonding—using a combination of pressure and ultrasonic vibration barsts to form a metallurgical cold weld; thermocompression bonding—using a combination of pressure and elevated temperature to form a weld; and thernosonic bonding—using a combination of pressure, elevated temperature, and ultrasonic vibration bursts. The die may be oriented either face up or face down (with its active surface and bond pads either up or down with respect to the circuit board) for wire bonding, although face up orientation is more common. With TAB, ends of metal leads carried on an insulating tape such as a polyimide are attached to the bond pads on the semiconductor die and to corresponding lead or trace ends on the printed circuit board. A glob top encapsulant is generally used to cover the bond wires and metal tape leads to prevent contamination and to aid mechanical attachment of the assembly components.

Higher performance, lower cost, increased miniaturization of components, and greater packaging density of integrated circuits are ongoing goals of the computer industry. Greater integrated circuit density is primarily limited by the space or "real estate" available for mounting die on a substrate such as a printed circuit board. Conventional lead frame design inherently limits package density for a given die size because the die-attach paddle of the lead frame must be larger than the die to which it is bonded. The larger the die, the less relative space that remains around the periphery of the die-bonding pad for wire bonding. Furthermore, the inner lead ends on a lead frame provide anchor points for the leads when the leads and the die are encapsulated in plastic, as by transfer molding. The anchor points may be emphasized as lateral flanges or bends or kinks in the lead. Therefore, as the die size is increased in relation to a given package size, there is a corresponding reduction in the space (lateral depth) along the sides of the package for the encapsulating plastic which joins the top and bottom portions of the molded plastic body at the mold part line and anchors to the leads. As the leads are subjected to the normal stresses of trimming, forming and assembly operations, the encapsulating plastic may crack, which may destroy the package seal and substantially increase the probability of premature device failure.

A so-called "leads over chip" ("LOC") arrangement eliminates the die-attach paddle of the lead frame and supports the die by its active surface from the inner lead ends of the lead frame. This permits a wider variety of bond pad patterns on the die, extends the leads-to-encapsulant bond area and, with appropriate design parameters, can reduce the size of the packaged device for a given die size.

One method of increasing integrated circuit density is to stack dice vertically. U.S. Pat. No. 5,012,323 ("the '323 patent") issued Apr. 30, 1991 to Farnworth teaches combining a pair of dice mounted on opposing sides of a lead frame. An upper die is back-bonded to the upper surface of the leads of the lead frame via a first adhesively coated, insulated film layer. The lower die is face-bonded to the lower lead frame die-bonding region via a second, adhesively coated, insulative, film layer. The wire-bonding pads on both upper die and lower die are interconnected with the ends of their associated lead extensions with gold or aluminum wires. The lower die needs to be slightly larger than the upper die in order that the lower die bonding pads are accessible from above through an aperture in the lead frame such that gold wire connections can be made to the lead extensions. However, this arrangement has a major disadvantage from a production standpoint, since the different size dice require that different equipment produce the different dice or that the same equipment be switched over in different production runs to produce the different dice. Moreover, the lead frame design employed by Farnworth employs long conductor runs between the die and the exterior of the package, and the lead frame configuration is specialized and rather complex.

U.S. Pat. No. 4,862,245 issued Aug. 29, 1989 to Pashby discloses a "leads over chip" (LOC) configuration, wherein the inner lead ends of a standard dual-in-line package (DIP) lead frame configuration extend over and are secured to the upper (active) surface of the die through a dielectric layer. The bond wire length is thus shortened by placing the inner lead ends in closer proximity to a central row of die bond pads, and the lead extensions purportedly enhance heat transfer from the die. However, the Pashby LOC configuration, as disclosed, relates to mounting and bonding only a single die.

U.S. Pat. No. 5,239,198 issued Aug. 24, 1993 to Lin et al. teaches an overmolded semiconductor device which achieves a multiple chip module without increasing the size of a fully package device. A semiconductor device is fabricated by providing a substrate on which a pattern of conductive traces is provided on a surface of the substrate. One electronic component is interconnected to the pattern of conductive traces, and a packaged body is overmolded around the electronic component and a portion of the pattern of conductive traces which leave a portion of the pattern of conductive traces exposed. Solder balls are attached to the exposed conductive traces and edge leads are connected to the periphery of the substrate. Both the solder balls and the edge leads provide external electrical connections to the device.

U.S. Pat. No. 5,291,061 issued Mar. 1, 1994 to Ball teaches a multiple stacked die device that contains up to four dies which does not exceed the height of current single die packages. The low profile of the device is achieved by close-tolerance stacking which is made possible by a low-loop-profile wirebonding operation and thin-adhesive layers between the stack dies. However, Ball secures all of the dice to the same (upper) side of the lead frame, necessarily increasing bond wire length, even if some of the leads are bent upwardly. Moreover, Ball employs a die paddle to support the die stack, a technique which requires an extra die-attach step, and which increases the distance between the inner lead ends and even the lowermost die in the stack, resulting in longer bond wires.

U.S. Pat. No. 5,323,060 issued Jun. 21, 1994 to Fogal et al. teaches a multichip module that contains stacked die devices, the terminals or bond pads of which are wirebonded to a substrate or to adjacent die devices.

U.S. Pat. No. 5,399,898 issued May 21, 1995 to Rostoker ("Rostoker") teaches multichip, multitier semiconductor arrangements based on single and double-sided flip-chips. FIGS. 3a and 3b of Rostoker illustrate the use of dice with electrical contact points on both the back and face surfaces of a die. Using these dice to form a stacked die package eliminates the need for wirebonding and thus reduces the size of the stacked die package. These dice are double-sided flip-chips wherein the internal circuitry provides the appropriate circuit traces. However, these double-sided flip-chips are expensive and difficult to manufacture.

U.S. Pat. No. 5,422,435 to Takiar et al. teaches stacked die having wire bonds extending to each other and to the leads of a carrier member such as a lead frame.

U.S. Pat. No. 5,471,369 to Honda et al. teaches stacked die package in which the dice are secured so as to prevent displacement by the encapsulant flow front during a transfer molding process. The package includes at least two stacked semiconductor chips with at least two leadframes and utilizing both bond wires and TAB to connect said chips to said leadframes.

See also U.S. Pat. Nos. 4,264,917; 5,147,815; 5,252,857; 5,331,235; 5,438,224; 5,483,024; 5,484,959 and Japanese Patent Documents 1-28856 (Takeuchi); 3-169062 (Goto); 56-62351 (Sano) and 62-126661 (Sakafa) for disclosures of various multi-chip semiconductor assemblies.

It would be advantageous to develop a technique and assembly for increasing integrated circuit density using non-customized die configurations in combination with commercially-available, widely-practiced semiconductor device fabrication techniques.

SUMMARY OF THE INVENTION

The present invention relates to an apparatus and a method for increasing integrated circuit density utilizing flip chips with both direct connect LOC technology and wire bonds and/or TAB.

One aspect of the present invention comprises a semiconductor die with a face surface having both flip chip electric connections (such as a C4 solder bump connection or conductive polymer bump, these and other alternatives being known in the art, by way of example) and conventional bond pads for wirebonding or TAB.

One embodiment of this aspect comprises a single semiconductor die having a leadframe in a LOC arrangement wherein a plurality of lead fingers extend over the die. Some of the plurality of lead fingers are attached to the flip chip electric connections, and a plurality of bond wires connect the bond pads to others of the plurality of the lead fingers. A layer of dielectric or insulation or a non-conductive adhesive is preferably positioned between the lead fingers and die surface in this embodiment, as well as those described below.

Another embodiment of this aspect comprises a pair of semiconductor dice positioned one atop another having a leadframe in a LOC arrangement wherein a first plurality of lead fingers extendes over an upper die. Some of the first plurality of lead fingers are attached to corresponding flip chip electric connections of the upper die, and a plurality of bond wires connects the bond pads of the upper die to others of the plurality of the first lead fingers. A second plurality of lead fingers extends between the upper die and a lower die. Some of the second plurality of lead fingers are attached to the flip chip electric connections of the lower die, and a plurality of bond wires connects the bond pads of the lower die to others of the plurality of second lead fingers.

Still other embodiments include adhering a pair of dice back to back. With a back to back dice pair arrangement, a third plurality of lead fingers can be used to electrically connect the dice to the leadframe without having to rotate the chip assembly to make the connections.

It is of course understood that, rather than using a single leadframe with its lead fingers extended to and attached to each of the dice, multiple lead frames can be used.

Another aspect of the present invention comprises using two pair of back to back attached dice. This aspect comprises an upper dice pair and a lower dice pair. The upper die face surface of the lower dice pair and the lower die face surface of the upper dice pair face one another with a plurality of lead fingers disposed therebetween. Each of the upper die face surface of the lower dice pair and the lower die face surface of the upper dice pair have a plurality of flip chip electric connections which are connected to and make electrical contact with their respective lead fingers of the leadframe. The upper die face surface of the upper die pair and the lower die face surface of the lower die pair face surface have a plurality of bond pads to which a bond wires and/or TAB can be attached to make electrical connection with the leadframe. This aspect requires the inversion of the die assembly during fabrication to make the bond wire and/or TAB attachments.

It is of course understood that a multitude of die arrangements may be devised using the aspects of this invention.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Figure 1:
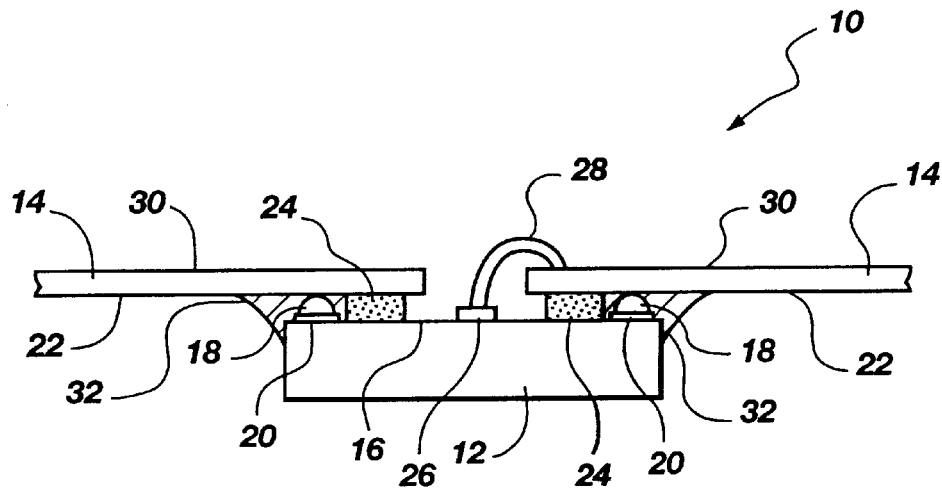
FIG. 1 is a side plan view of one assembly of the present invention.

FIG. 1 illustrates a die assembly 10 of the present invention. The assembly 10 comprises a die 12 connected to a leadframe or other conductor-carrying substrate 14. Fabrication of the die assembly 10 comprises providing the die 12 having a die face surface 16 with at least one flip chip-type direct electric connection 18 extending from a bond pad or other terminal 20 on the die face surface 16. The flip chip electric connections 18 extend to a lower surface 22 of the substrate 14 in such a manner that the flip chip electric connections 18 physically (mechanically) attach to, and make electrical contact with, lead ends, trace ends, terminals or other electrical contact elements in or on the lower surface 22 of the substrate 14. A layer or film of dielectric or insulative material 24 is preferably positioned between the die face surface 16 and the lower surface 22 of the substrate 14. Such material may include an adhesive on one or both sides thereof to facilitate assembly, or may comprise a non-conductive adhesive, applied as by screen-printing.

The die face surface 16 also includes a plurality of central bond pads 26 disposed thereon. A plurality of bond wires 28 is attached between the central bond pads 26 and corresponding trace or lead ends or other terminals on the upper surface 30 of the substrate 14.

A sealing (underfed) compound 32, as known in the art, may be disposed between the die 12 and the substrate 14 to prevent contamination of the flip chip electric connections 18 and to more firmly secure the die 12 to the substrate 14. A glob top (not shown) may be applied over die assembly 10 individually or over the entire substrate 14, which may support a plurality of die assemblies 10. The subsequently-described embodiments may similarly be glob-topped, as desired. The die 12, bond wires 28 and inner portions of the lead ends (if a leadframe is employed) may be plastic encapsulated as by transfer molding.

Figure 2:
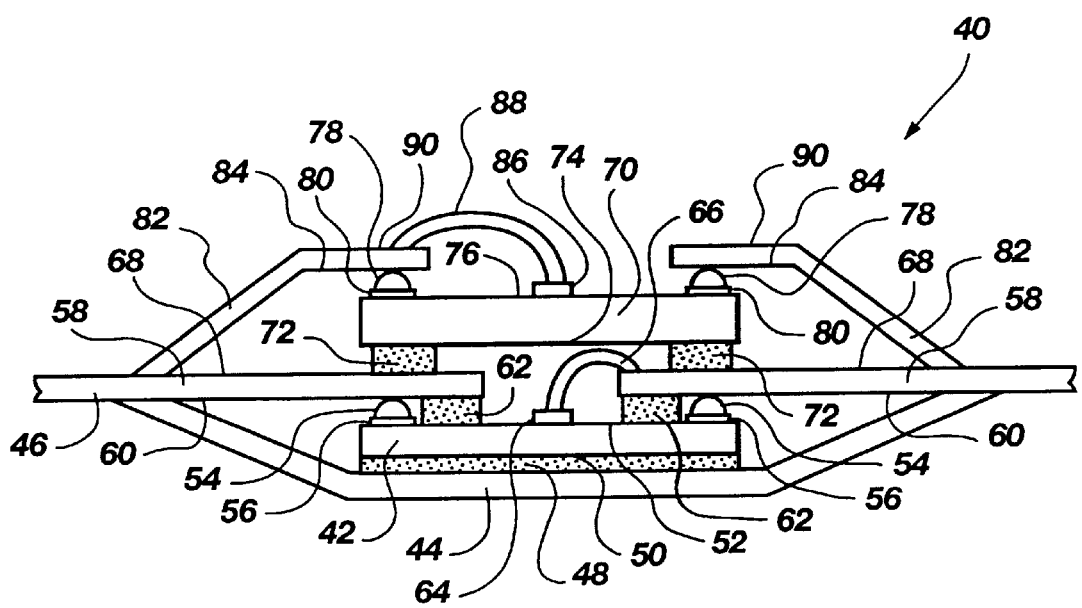
FIG. 2 is a side plan view of an alternate assembly of the present invention.

FIG. 2 illustrates an alternative die assembly 40 of the present invention. The die assembly 40 comprises a lower die 42 attached to a die-attach paddle or support 44 of a leadframe 46 by a first layer of adhesive 48 applied over the back side 50 of the lower die 42 or over support 44. The first adhesive layer 48 is preferably an electrically insulative adhesive as required or desired to electrically isolate the lower die 42 from support 44. The lower die 42 has a lower die face surface 52 with at least one lower flip chip electric connection 54 extending from a bond pad or other terminal 56 on the lower die face surface 52. A first plurality of lead fingers 58 extends over the lower die face surface 52. The lower die flip chip electric connections 54 extend to a lower surface 60 of the first plurality of lead fingers 58 in such a manner that the lower flip chip electric connections 54 physically (mechanically) attach to, and make electrical contact with, lower surfaces 60 of the first plurality of lead fingers 58. A layer or film of dielectric or insulative material 62 is preferably positioned between the lower die face surface 52 and a lower surface 60 of the first plurality of lead fingers 58. An adhesive may be employed on one or both surfaces of shielding to facilitate assembly, or a non-conductive adhesive employed in lieu of a discrete material layer.

The lower die face surface 52 also includes a plurality of lower die central bond pads 64 disposed thereon. A plurality of low-loop height bond wires 66 are formed between the lower die central bond pads 64 and corresponding trace or lead ends or other terminals on the upper surface 68 of the first lead fingers 58.

An upper die 70 is adhesively attached to the upper surface 68 of the first plurality of lead fingers 58 with a second layer of dielectric or insulative shielding 72 applied on the back side 74 of the upper die 70. The upper die 70 has an upper die face surface 76 with at least one upper die flip chip electric connection 78 extending from a bond pad or other terminal 80 on the upper die face surface 76. A second plurality of lead fingers 82 extend over the upper die face surface 76. The upper die flip chip electric connections 78 extend to a lower surface 84 of the second plurality of lead fingers 82 in such a manner that the upper die flip chip electric connections 78 physically (mechanically) attach to, and make electrical contact with, lower surfaces 84 of the second plurality of lead fingers 82.

The upper die face surface 76 also includes a plurality of upper die central bond pads 86 disposed thereon. A plurality of bond wires 88 are attached between the upper die central bond pads 86 and corresponding trace or lead ends or other terminals on upper surfaces 90 of the second lead fingers 82. The assembly of FIG. 2 may be encapsulated as known in the art.

Figure 3:
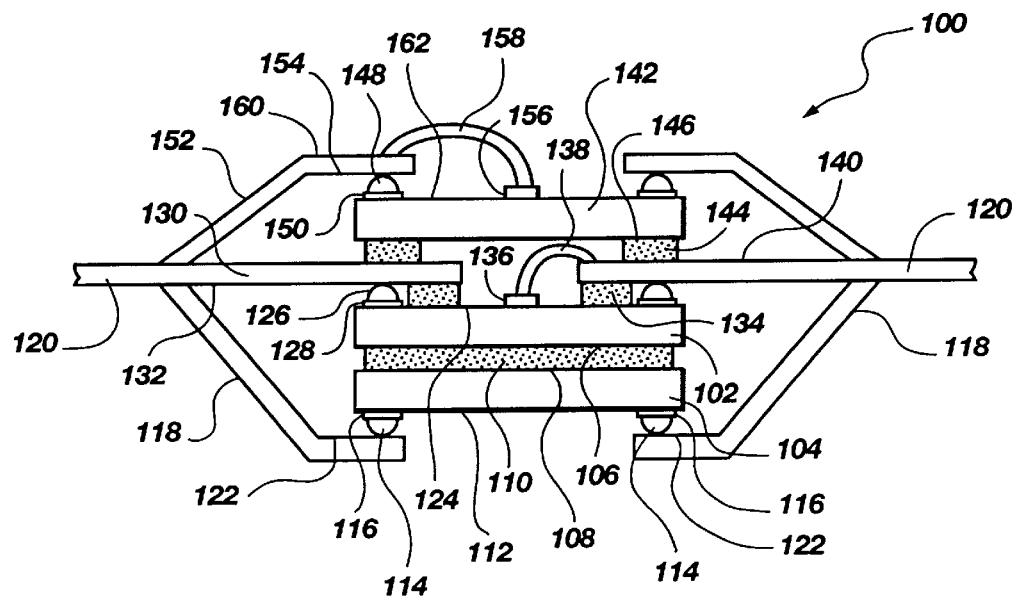
FIG. 3 is a side plan view of another alternate assembly of the present invention.

FIG. 3 illustrates another alternative die assembly 100 of the present invention. The die assembly 100 comprises a first lower die 102 and second lower die 104 wherein a back side 106 of the first lower die 102 is adhered to the second lower die 104 with a layer of adhesive 110 applied over a second lower die back side 108. An adhesive requiring a curing step, such as an epoxy, is preferred, although many adhesives (contact, thermoplastic, etc.) known in the art are suitable.

The second lower die 104 has a second lower die face surface 112 with at least one lower die flip chip electric connection 114 extending from a bond pad or other terminal 116 on the second lower die face surface 112. A first plurality of lead fingers 118 of leadframe or other substrate 120 extend under the second lower die face surface 112. The second lower die flip chip electric connections 114 extend to an upper surface 122 of the first plurality of lead fingers 118 in such a manner that the second lower flip chip electric connections 114 physically (mechanically) attach to, and make electrical contact with, upper surfaces 122 of the first plurality of lead fingers 118.

The first lower die 102 has a face surface 124 with at least one flip chip electric connection 126 extending from a bond pad or other terminal 128 on the first lower die face surface 124. A second plurality of lead fingers 130 of leadframe 120 extend over the first lower die face surface 124. The first lower die flip chip electric connections 126 extend to a lower surface 132 of the second plurality of lead fingers 130 in such a manner that the first lower flip chip electric connections 126 physically (mechanically) attach to, and make electrical contact with, lower surfaces 132 of the second plurality of lead fingers 130. A layer or film of dielectric or insulative material 134 is preferably positioned and adhered between the first lower die face surface 124 and the lower surface 132 of the second plurality of lead fingers 130.

The first lower die face surface 124 may also include a plurality of central bond pads 136 disposed thereon. A plurality of bond wires 138 are attached between the first lower die central bond pads 136 and corresponding trace or lead ends or other terminals on an upper surface 140 of the second plurality of lead fingers 130.

An upper die 142 is attached to the upper surface 140 of the second plurality of lead fingers 130 with a second layer of adhesively-faced dielectric or insulative material 144 applied between a back side 146 of the upper die 142 and the upper surface 140 of the second plurality of lead fingers 130. The upper die 142 has a face surface 162 with at least one flip chip electric connection 148 extending from a bond pad or other terminal 150 on the upper die face surface 162. A third plurality of lead fingers 152 extend over the upper die face surface 162. The upper die flip chip electric connections 148 extend to a lower surface 154 of the third plurality of lead fingers 152 in such a manner that the upper flip chip electric connections 148 physically (mechanically) attach to, and make electrical contact with, lower surfaces 154 of the third plurality of lead fingers 152.

The upper die face surface 162 also includes a plurality of central bond pads 156 disposed thereon. A plurality of bond wires 158 are attached between the lower die central bond pads 156 and corresponding trace or lead ends or other terminals on an upper surface 160 of the third plurality of lead fingers 152.

It is, of course, understood that second lower die 104 could also include a plurality of central bond pads on the second lower die face surface 112 which are connected to a lower surface of the first plurality of lead fingers 118 by a plurality of bond wires, such connections being effected by a wire bonder after the assembly was inverted. It is also understood that a number of dice could be stacked in multiple configuration with any number of lead finger arrangements.

Figure 4:
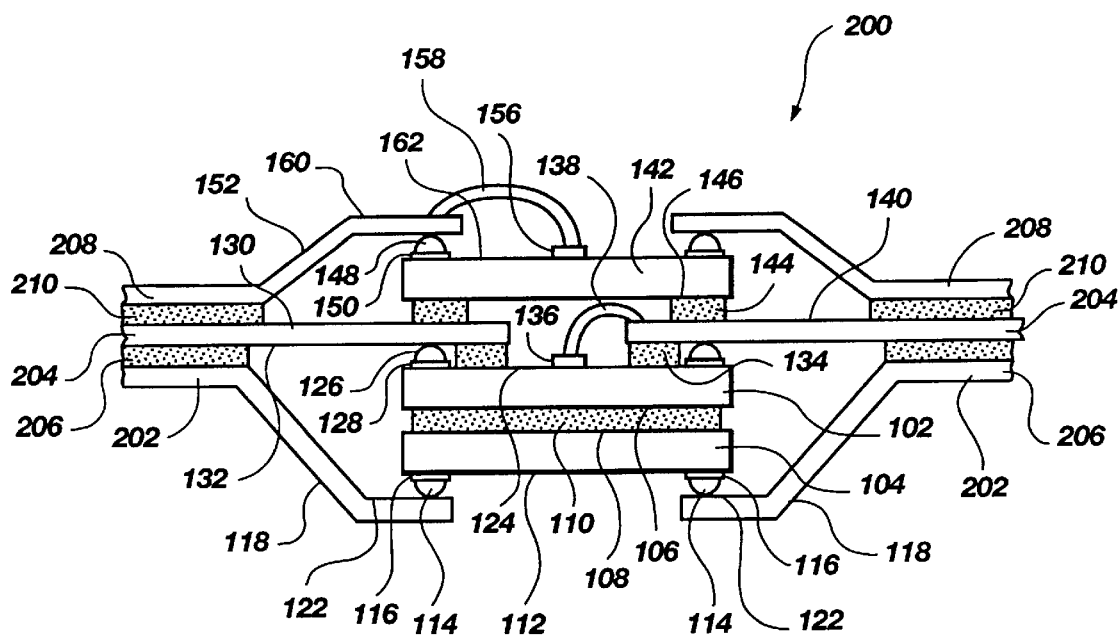
FIG. 4 is a side plan view of yet another alternative assembly of the present invention.

FIG. 4 illustrates yet another alternative die assembly 200 of the present invention. The die assembly 200 is very similar in structure to FIG. 3. Thus, components common to both FIG. 3 and FIG. 4 retain the same numeric designation. FIG. 4 comprises the same die configuration of FIG. 3 with the exception that each set of lead fingers originates from a separate leadframe or other substrate. Thus, the first plurality of lead fingers 118 extends from a first leadframe or substrate 202. The second plurality of lead fingers 130 extends from a second leadframe or substrate 204. The first leadframe 202 is preferably separated from the second leadframe 204 by a first leadframe insulative shielding 206.

The third plurality of lead fingers 152 extends from a third leadframe or substrate 208. The second leadframe 204 is preferably separated from the third leadframe 208 by a second leadframe insulative shielding 208.

Figure 5:
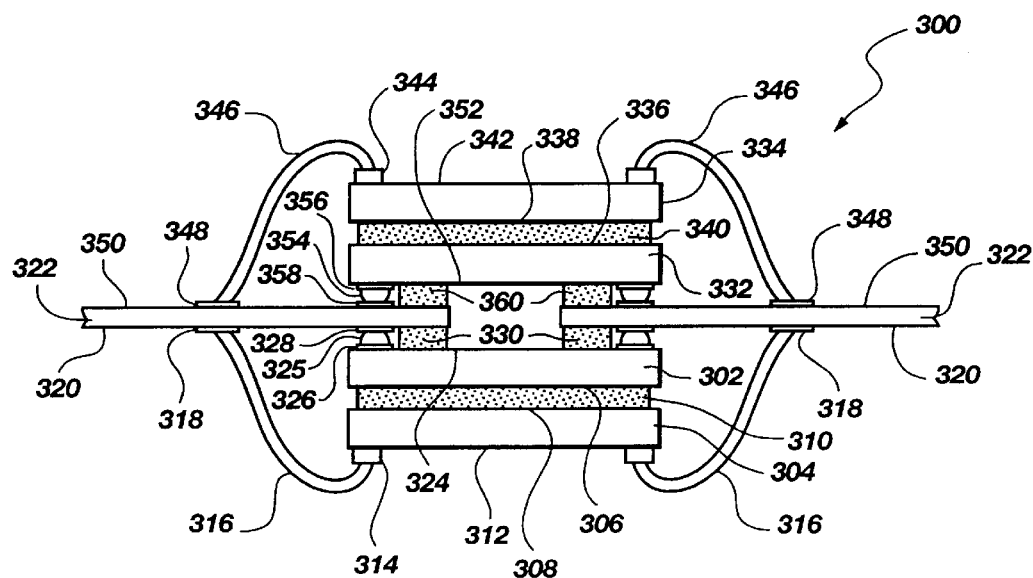
FIG. 5 is a side plan view of still another alternative assembly of the present invention.

FIG. 5 illustrates still another alternate die assembly 300 of the present invention. The assembly 300 comprises a first lower die 302 and a second lower die 304 wherein a back side 306 of the first lower die 302 is adhered to the second lower die 304 with a layer of adhesive 310 applied over a second lower die back side 308.

The second lower die 304 has a face surface 312 with at least one bond pad or other terminal 314. A first plurality of bond wires 316 electrically connect the second lower die bond pads 314 to a plurality of bond pads 318 on a lower surface 320 of a leadframe or other substrate 322.

The first lower die 302 has a face surface 324 with at least one flip chip electric connection 325 extending from a bond pad or other terminal 326 on the first lower die face surface 324. The leadframe 322 extends over the first lower die face surface 324. The first lower die flip chip electric connections 325 extend to the lower surface 320 of the leadframe 322 in such a manner that the first lower flip chip electric connections 325 physically (mechanically) attach to, and make electrical contact with, a bond pad or other electrical contact point 328 on the leadframe lower surface 320. A layer or film of dielectric or insulative material 330 is preferably positioned and adhered between the first lower die face surface 324 and the leadframe lower surface 320.

The assembly 300 further comprises a first upper die 332 and a second upper die 334 wherein a back side 336 of the first upper die 332 is adhered to the second upper die 334 with a layer of adhesive 340 applied over a second upper die back side 338, forming essentially a mirror image of the lower dice arrangement. The second upper die 334 has a face surface 342 with at least one bond pad or other terminal 344 on the second upper die face surface 342. A first plurality of bond wires 346 electrically connect the second upper die bond pads 344 to a plurality of bond pads 348 on an upper surface 350 of the leadframe or other substrate 322.

The first upper die 332 has a face surface 352 with at least one flip chip electric connection 354 extending from a bond pad or other terminal 356 on the first upper die face surface 352. The leadframe 322 extends under the first upper die face surface 352. The first upper die flip chip electric connections 352 extend to the upper surface 350 of the leadframe 322 in such a manner that the first lower flip chip electric connections 354 physically (mechanically) attach to, and make electrical contact with, a bond pad or other electrical contact point 358 on the leadframe upper surface 350. A layer or film of dielectric or insulative material 360 is preferably positioned and adhered between the first lower die face surface 352 and the leadframe upper surface 350.

Figure 6:
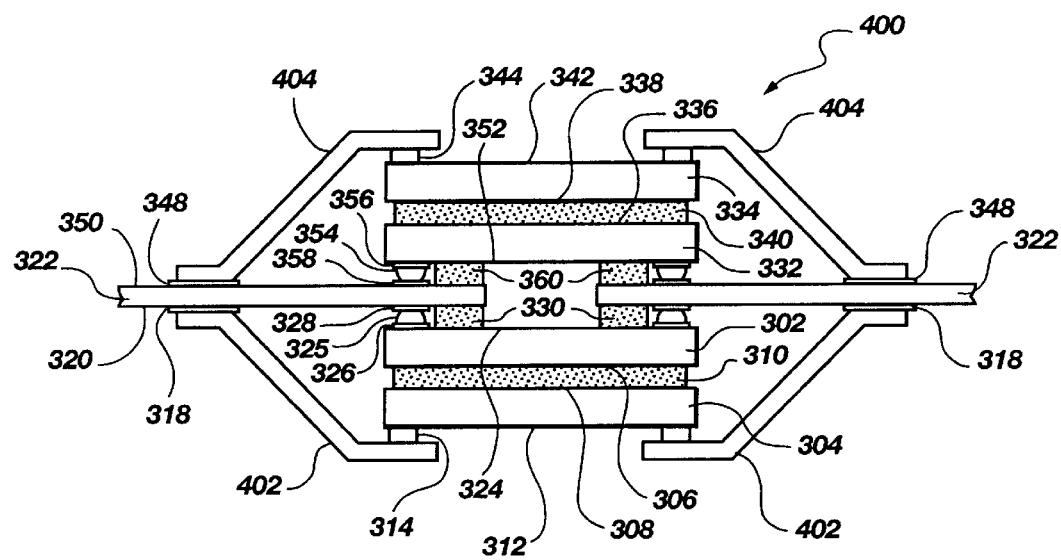
FIG. 6 is a side plan view of yet another alternative assembly of the present invention.

FIG. 6 illustrates yet another alternative die assembly 400 of the present invention. The assembly 400 is very similar in structure to FIG. 3. Thus, components common to both FIG. 5 and FIG. 6 retain the same numeric designation. FIG. 6 comprises the same die configuration of FIG. 5 with the exception that TAB or flex circuit connections 402 and 404 replace the bond wires 316 and 346 of FIG. 5, respectively.

Having thus described in detail preferred embodiments of the present invention, it is to be understood that the invention defined by the appended claims is not to be limited by particular details set forth in the above description, as many apparent variations thereof are possible without departing from the spirit or scope thereof.

What is claimed is:

1. A method of constructing a semiconductor die assembly comprising:
   providing a first semiconductor die having at least one direct-to-substrate conductor type electrical connector;
   providing a second semiconductor die having at least one bond pad;
   directly adhering said first semiconductor die and said second semiconductor die back-to-back;
   providing at least one substrate including a plurality of conductors;
   directly connecting said at least one direct-to-substrate conductor type electrical connector to one of said plurality of conductors; and
   connecting said at least one bond pad to a second one of said plurality of conductors through an intermediate conductive element.

2. The method of claim 1, wherein connecting said at least one direct-to-substrate conductor type electrical connector comprises refluxing solder.

3. The method of claim 1, wherein connecting said at least one direct-to-substrate conductor type electrical connector comprises adhering a polymer having a conductive capability.

4. The method of claim 1, wherein connecting said at least one bond pad comprises attaching at least one bond wire between said at least one bond pad and said second one of said plurality of conductors.

5. The method of claim 1, wherein connecting said at least one bond pad comprises attaching at least one metal trace carried on a dielectric film between said at least one bond pad and said second one of said plurality of conductors.

6. The method of claim 1, further comprising:
   providing a third semiconductor die having at least one direct-to-substrate conductor type electrical connector;
   providing a fourth semiconductor die having at least one bond pad;
   adhering said third semiconductor die and said fourth semiconductor die back-to-back;
   directly connecting said at least one direct-to-substrate conductor type electrical connector of said third semiconductor die to one of said plurality of conductors; and
   connecting said at least one bond pad of said fourth semiconductor die to a second one of said plurality of conductors through an intermediate conductive element.

7. A method of constructing a semiconductor die assembly comprising:
   providing a first semiconductor die having at least one direct-to-substrate conductor type electrical connector and at least one bond pad;
   providing a second semiconductor die having at least one direct-to-substrate conductor type electrical connector;
   directly adhering said first semiconductor die and said second semiconductor die back-to-back;
   providing at least one substrate including a first plurality of conductors and a second plurality of conductors, each of said first and said second plurality of conductors having a first conductive surface and a second conductive surface;
   directly connecting said at least one direct-to-substrate conductor type electrical connector of said first semiconductor die to a first conductive surface of one of said first plurality of conductors;
   connecting said at least one bond pad of said first semiconductor die to a second conductive surface of a second one of said first plurality of conductors through an intermediate conductive element; and
   directly connecting said at least one direct-to-substrate conductor type electrical connector of said second semiconductor die to a first conductive surface of one of said second plurality of conductors.

8. The method of claim 7, wherein connecting said at least one direct-to-substrate conductor type electrical connector of said first semiconductor die comprises reflowing solder; and wherein connecting said at least one direct-to-substrate conductor type electrical connector of said second semiconductor die comprises refluxing solder.

9. The method of claim 7, wherein connecting said at least one direct-to-substrate conductor type electrical connector of said first semiconductor die comprises adhering a polymer having a conductive capability; and wherein connecting said at least one direct-to-substrate conductor type electrical connector of said second semiconductor die comprises adhering a polymer having a conductive capability.

10. The method of claim 7, wherein connecting said at least one bond pad of said first semiconductor die comprises attaching at least one bond wire between said at least one bond pad and said second one of said first plurality of conductors.

11. The method of claim 7, wherein connecting said at least one bond pad of said first semiconductor die comprises attaching at least one metal trace carried on a dielectric film between said at least one bond pad and said second one of said first plurality of conductors.

12. The method of claim 7, further comprising:
   providing a third semiconductor die having at least one direct-to-substrate conductor type electrical connector and at least one bond pad;
   wherein said at least one substrate includes a third plurality of conductors, each of said third plurality of conductors having a first conductive surface and a second conductive surface;
   directly connecting said at least one direct-to-substrate conductor type electrical connector of said third semiconductor die to a first conductive surface of one of said third plurality of conductors; and
   connecting said at least one bond pad of said third semiconductor die to a second conductive surface of a second one of said third plurality of conductors through an intermediate conductive element.

13. The method of claim 12, wherein connecting said at least one direct-to-substrate conductor type electrical connector of said third semiconductor die comprises reflowing solder.

14. The method of claim 12, wherein connecting said at least one direct-to-substrate conductor type electrical connector of said third semiconductor die comprises adhering a polymer having a conductive capability.

15. The method of claim 12, wherein connecting said at least one bond pad of said third semiconductor die comprises attaching at least one bond wire between said at least one bond pad and said second one of said third plurality of conductors.

16. The method of claim 12, wherein connecting said at least one bond pad of said third semiconductor die comprises attaching at least one metal trace carried on a dielectric film between said at least one bond pad and said second one of said third plurality of conductors.

* * * * *

UNITED STATES PATENT AND TRADEMARK OFFICE
CERTIFICATE OF CORRECTION

PATENT NO. : 6,080,264  
APPLICATION NO. : 08/818636  
DATED : June 27, 2000  
INVENTOR(S) : Michael B. Ball Page 1 of 1

It is certified that error appears in the above-identified patent and that said Letters Patent is hereby corrected as shown below:

| | | |
|---|---|---|
| COLUMN 3, | LINE 35, | change "package device" to --packaged device-- |
| COLUMN 4, | LINE 56, | change "extendes" to --extends-- |
| COLUMN 6, | LINE 6, | change "(underfed)" to --(underfill)-- |
| COLUMN 6, | LINE 44, | at the beginning of the line before "lower" insert --plurality of-- |
| COLUMN 6, | LINE 46, | after "first" and before "lead" insert --plurality of-- |
| COLUMN 6, | LINE 62, | change "ofupper" to --of upper-- |

Signed and Sealed this

Seventeenth Day of July, 2007

JON W. DUDAS  
*Director of the United States Patent and Trademark Office*